United States Patent [19]

Matsuoka et al.

[11] Patent Number: 4,865,554
[45] Date of Patent: Sep. 12, 1989

[54] SOCKET FOR THE USE OF AN ELECTRIC PART

[75] Inventors: Noriyuki Matsuoka; Junji Ishida, both of Tokyo, Japan

[73] Assignee: Yamaichi Electric Mfg. Co., Ltd., Japan

[21] Appl. No.: 276,851

[22] Filed: Nov. 28, 1988

[30] Foreign Application Priority Data

Nov. 26, 1987 [JP] Japan ................................ 62-298665

[51] Int. Cl.[4] ............................................. H05K 1/00
[52] U.S. Cl. ..................................... 439/70; 439/525; 439/152; 439/330
[58] Field of Search .................... 439/330, 331, 68–73, 439/152–159, 525; 361/413, 414, 415

[56] References Cited

U.S. PATENT DOCUMENTS

| 4,190,310 | 2/1980 | Bright et al. | 439/153 |
|---|---|---|---|
| 4,266,840 | 5/1981 | Seidler | 439/330 |
| 4,402,563 | 9/1983 | Sinclair | 439/73 |
| 4,750,890 | 6/1988 | Dube et al. | 439/152 |
| 4,750,891 | 6/1988 | Egawa | 439/259 |

Primary Examiner—David Pirlot
Attorney, Agent, or Firm—Wenderoth, Lind & Ponack

[57] ABSTRACT

A socket for the use of an electric part has contacts disposed in such a manner as to contact with contact pieces or leads of an electric part and a stage with the electric part supported thereon and able to move between a lower position where the contact pieces are brought into contact with the contacts and an upper position where the contact pieces are brought out of contact with the contacts. The socket further has a swingable crankshaft as means for restraining the stage in the upper or lower position. The crankshaft is provided with a crank bar portion disposed in such a manner as to vertically move upward and downward while supporting the stage and to push up the stage during a raising movement thereof and a crank arm portion which is swung about the crank bar portion and engaged with lock means thereby to restrain the stage in the upper and lower positions.

4 Claims, 11 Drawing Sheets

SOCKET FOR THE USE OF AN ELECTRIC PART

BACKGROUND OF THE INVENTION

This invention relates to a socket for the use of an electric part such as an integrated circuit board.

Figure 22:
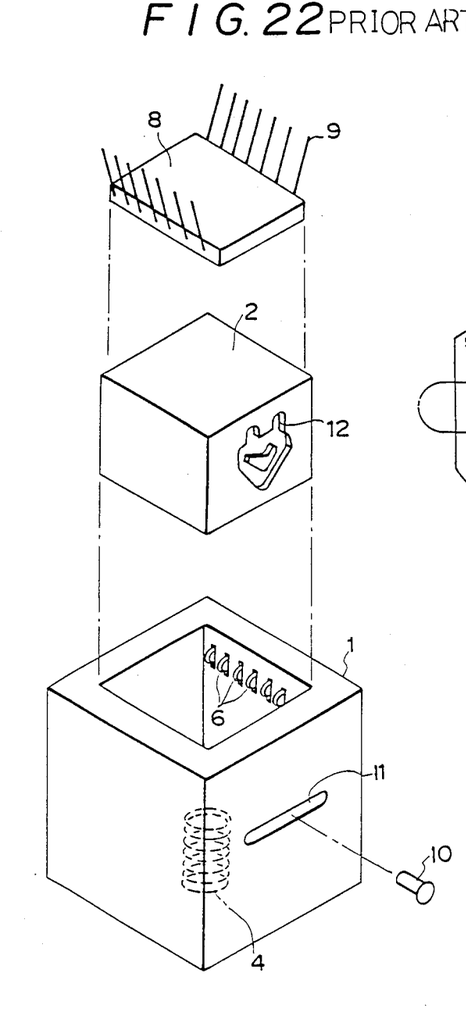
FIG. 22 is an exploded perspective view of the conventional socket.
Figure 23:
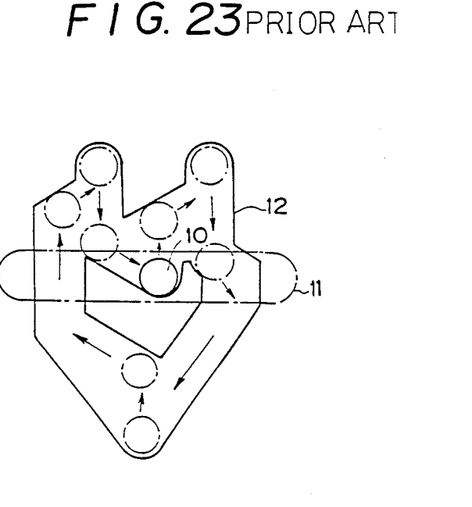
FIG. 23 is a view for explaining the operation of the cam slot and the pivot pin of FIG. 22.

A conventional device of this type, as shown in FIG. 22, comprises a socket body 1 formed in one wall section thereof with a slot 11 for permitting a pivot and bearing pin 10 to be slidingly moved therealong, a plurality of resilient contacts adapted to contact with corresponding contact pieces or leads formed on an electric part 8, a movable stage or support platform 2 which is utilized for supporting the electric part 8 and provided with a cam slot 12 formed in at least one side of the stage and a coil spring 4 for biasing the stage 2 upward, the front end of the pivot and bearing pin 10 being engaged in the cam slot 12 formed in the stage 2. As can be understood from a plan view of FIG. 23 showing the operation of the pivot and bearing pin 10 and the cam slot 12, when the stage 2 is urged downward, the stage 2 is temporarily restrained in an upper or a lower position due to the cooperative action of the pivot and bearing pin 10 and the cam slot 12. At that time, the stage 2 with the cam slot 12 formed therein is vertically and reciprocally moved as a relative motion, whereas the pivot and bearing pin 10 is horizontally and reciprocally moved. When viewed as a relative motion from the stage 2, the pivot and bearing pin 10 is moved along the cam slot 12 to follow a generally unicircular orbit.

With the above-mentioned construction of the conventional device, however, since the pivot and bearing pin 10 is horizontally and reciprocally moved with respect to the vertical and reciprocal movement of the stage 2 for supporting an electric part, resistance of motion is abruptly increased at a place near both ends of the horizontal and reciprocal motion, i.e., at a position where the pivot and bearing pin 10 is displayed from the center line of the electric part supporting stage 2 with respect to the vertical motion of the stage 2, and this resistance acts as a force for inclining the stage 2. As a result, the vertical and reciprocal motion of the stage 2 is not smoothly performed with respect to the horizontal and reciprocal motion of the pivot and bearing pin 10. Thus, the operation of the conventional device is jeopardized.

SUMMARY OF THE INVENTION

It is therefore one object of the present invention to provide a socket for the use of an electric part which is very smooth to operate.

Another object of the invention is to provide a socket for the use of an electric part which is easy to manufacture.

A further object of the invention is to provide a socket for the use of an electric part in which a stage for supporting an electric part can be raised to an upper position and lowered to a lower position easily and without fail.

A still further object of the invention is to provide a socket for the use of an electric part in which a stage for supporting an electric part can be raised to an upper position by an evenly distributed force.

In order to achieve the above objects, a socket for the use of an electric part of the present invention has a swingable crankshaft as means for restraining a stage for supporting an electric part. The crankshaft is swung following a generally circular orbit to engage with lock means, thereby to restrain the stage in the upper or lower position.

In the present invention, both the pushing up function of the stage and the engaging function with the lock means are attained by only one crankshaft. The crankshaft supports the stage on its crank bar portion in the longitudinal direction and vertically moves the stage upward and downward. While vertically moving the stage upward and downward, the crankshaft renders a push-up force to the stage in the longitudinal direction of the crank bar so as to permit the stage to be vertically raised or lowered.

The crankshaft is freely swung on the crank bar portion as a fulcrum. That is, the crank bar portion is freely turned by itself and in the meantime, the crank arm portion is swung following a generally circular orbit to engage with the lock means.

The crankshaft renders only a uniform and vertical push-up force to the stage by its crank bar portion, thereby to effectively inhibit an unevenly distributed harmful force to be exerted to the stage and to properly vertically move the stage upward and downward.

BRIEF DESCRIPTION OF THE DRAWINGS

The above objects and still further objects and features of the present invention will immediately become apparent to those skilled in the art after consideration of the following preferred embodiments of the invention which are provided by way of example and not by way of limitation taken in conjunction with the accompanying drawings, wherein:

FIGS. 2(a) and 2(b) are perspective views of the same but in its assembled state, in which FIG. 2(a) shows a stage restrained in an upper position, whereas FIG. 2(b) shows the stage restrained in a lower position;

DETAILED DESCRIPTION OF THE EMBODIMENT

One embodiment of a socket for the use of an electric part of the present invention will be described with reference to the accompanying drawings.

Figure 1:
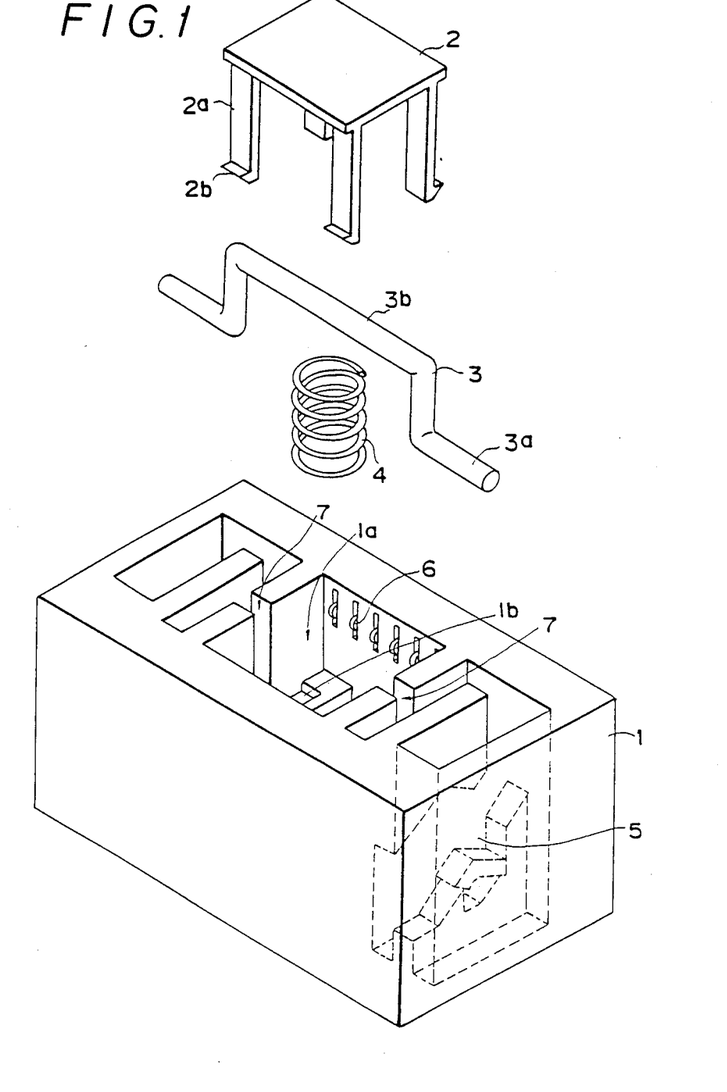
FIG. 1 is an exploded perspective view of a socket for the use of an electric part showing one embodiment of the present invention.
Figure 2A:
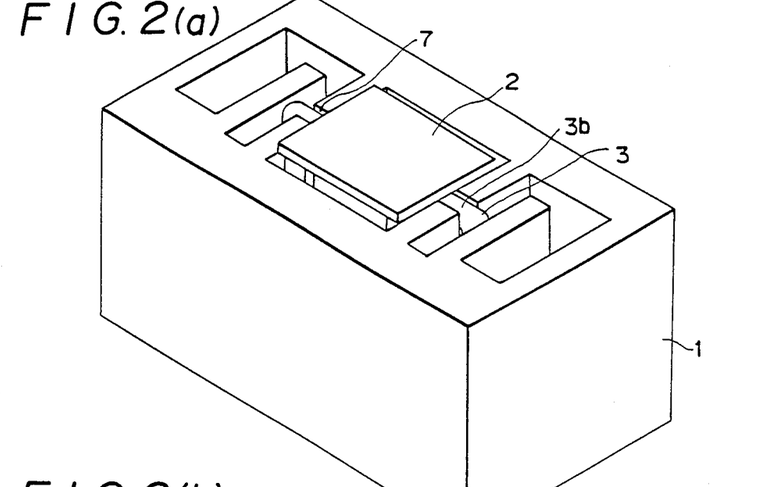
Figure 2B:
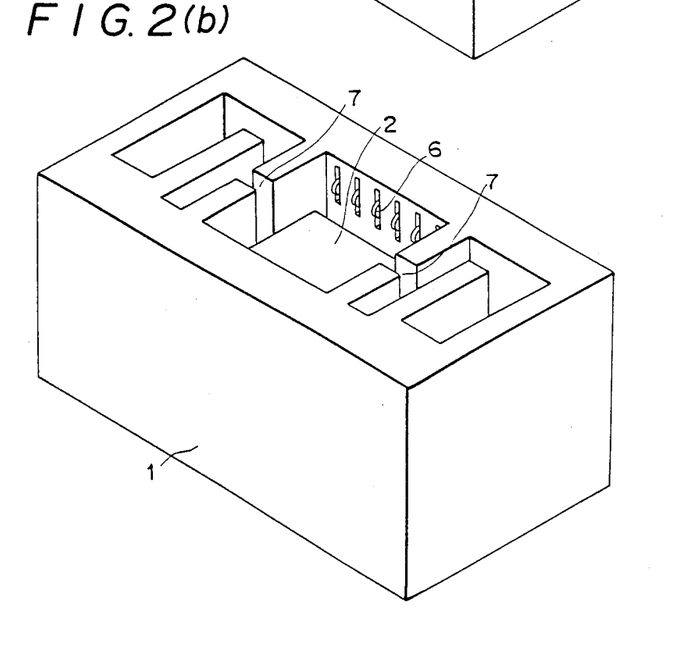
Figure 3:
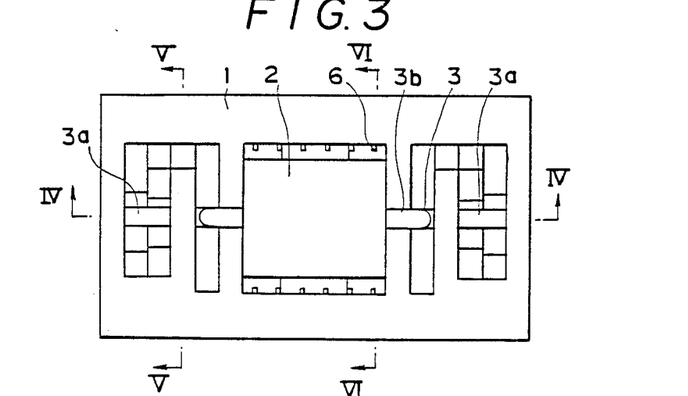
FIG. 3 is a plan view of the socket which is in the state of FIG. 2(a)
Figure 4:
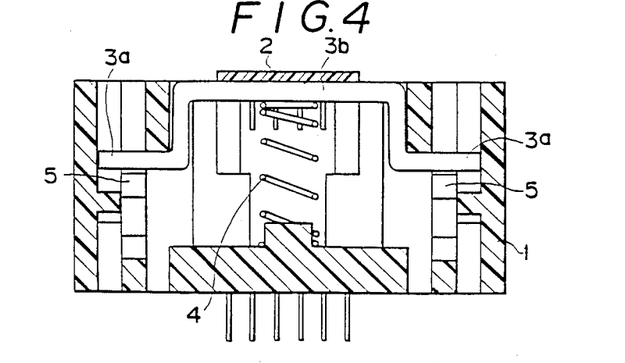
FIG. 4 is a sectional view taken on line IV—IV of FIG. 3.
Figure 5:
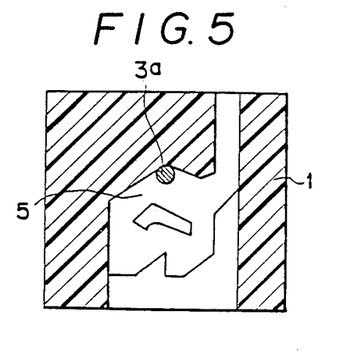
FIG. 5 is a sectional view taken on line V—V of FIG. 3.
Figure 6:
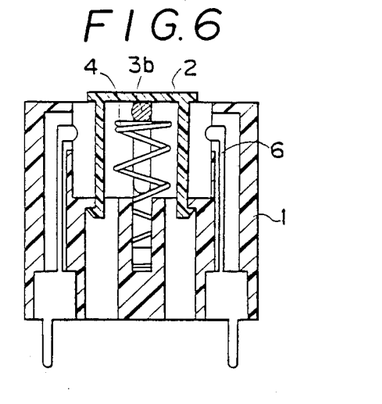
FIG. 6 is a sectional view taken on line VI—VI of FIG. 3.
Figure 7:
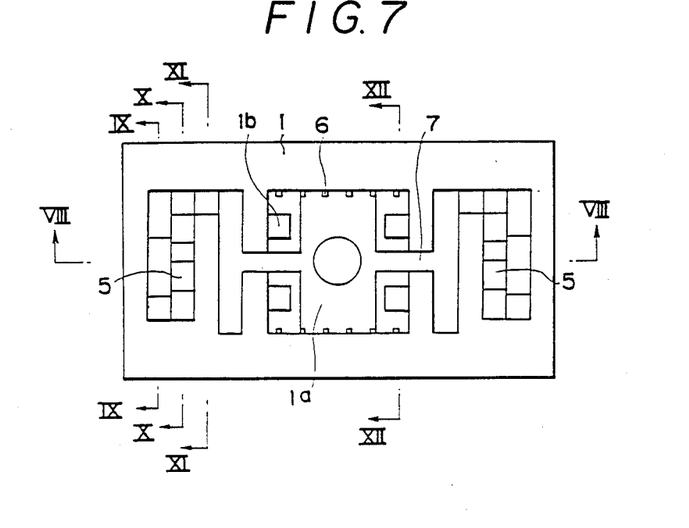
FIG. 7 is a plan view of a socket body.
Figure 8:
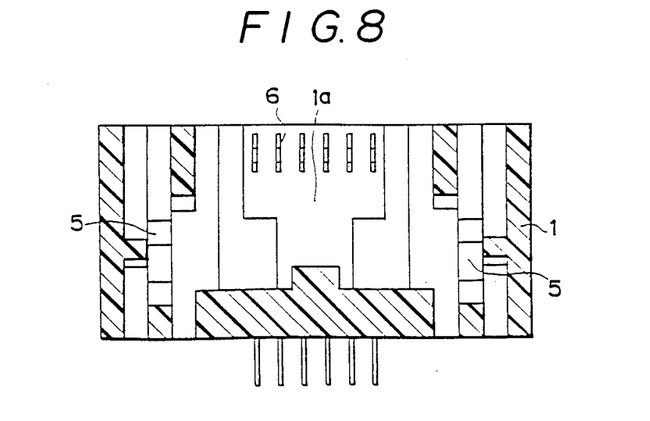
FIG. 8 is a sectional view taken on line VIII—VIII of FIG. 7.

Reference 1 denotes a socket body, 2 denotes a platform or stage for supporting an electric part thereon, 3 denotes a crankshaft, 4 denotes a coil spring and 5 denotes a hart-shape cam portion.

The crankshaft 3 is formed of wire material of a circular shape in section. The crankshaft 3 includes a crank bar portion 3a at a central portion thereof and a pair of crank arm portions 3a which are each formed by bending each end of the crank bar portion 3a in a generally L-shaped symmetrical with each other. The crank bar portion 2b supports the stage 2 in such a manner as to be separatable in the vertical direction with respect to the stage 2.

The socket body 1 has a generally rectangular electric part accommodating section 1a in a central portion thereof. The electric part accommodating section 1a is defined by four wall sections of the socket body 1. Two opposite wall sections are each provided with a plurality of contacts 6 adapted to contact with contact pieces or leads of the electric part. The remaining opposite wall sections are each provided with a hart-shape cam portion 5 exemplifying lock means for restraining the stage 2 in an upper or lower position in cooperation with the crankshaft 3. One ends of the crank arm portions 3a of the crankshaft 3 are engaged in the hart-shape cam portion 5, and the crank bar portion 3b for supporting the stage 2 is given a pushing-force in the upward direction by the coil spring 4.

Figure 9:
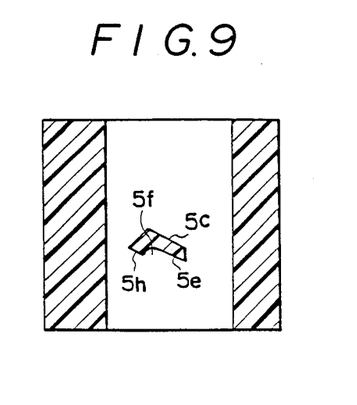
FIG. 9 is a sectional view taken on line IX—IX of FIG. 7.
Figure 10:
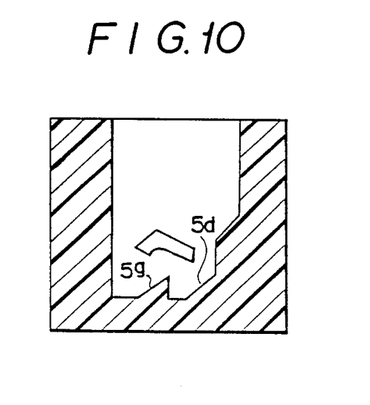
FIG. 10 is a sectional view taken on line X—X of FIG. 7.
Figure 11:
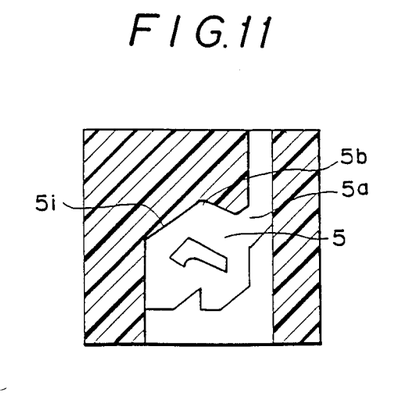
FIG. 11 is a sectional view taken on line XI—XI of FIG. 7.
Figure 12:
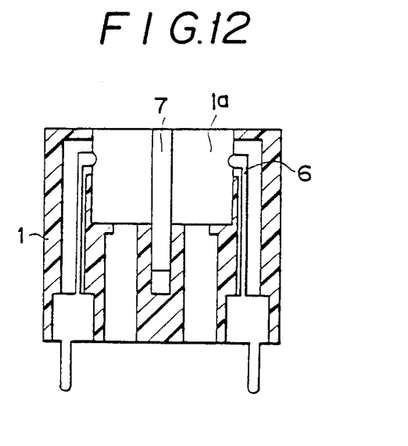
FIG. 12 is a sectional view taken on line XII—XII of FIG. 7.

The hart-shape cam portion 5, as shown in FIGS. 9 through 11, comprises an entrance 5a for the crank arm portion 3a, a first stop for establishing an upper position of the crank arm portion 3a, a first series of guide tapers 5c, 5d and 5e for guiding the crank arm portion 3a when the portion 3a is moved from the upper position to the lower position, a second stop for establishing the lower position of the crank arm portion 3a, and a second series of guide tapers 5g, 5h and 5i for guiding the crank arm portion 3a when the portion 3a is moved from the lower position to the upper position, and the crank arm portion 3a of the crank shaft 3 moves within the hart-shape cam portion 5 following a generally circular orbit.

The socket body 1 provided with a guide groove 7 extending in the vertical direction and for slide fitting with the both ends of the crank bar portion 3b as means for moving the crank shaft 3 upward and downward. The guide groove 7 permits the crankshaft 3 to move upward and downward, and more particularly, permits the crank bar portion 3b to move upward and downward therealong. Also, the crank arm portion 3a is permitted to swing on the crank bar portion 3b as a fulcrum to follow a generlly circular orbit. In other works, even when the crank arm portion 3a is swung, the crank bar portion 3b of the crank shaft 3 is only moved upward and downward.

When the stage 2 having a generally same shape as that of the electric part accommodating portion 1a is disposed within the portion 1a with the crank shaft 3 and the coil spring 4 disposed in the manner as mentioned above, the stage 2 is supported on the crank bar portion 3b. The stage 2 is provided with a plurality of legs 2a extending downward therefrom. The legs 2a are inserted in holes 1b formed in the vicinity of the central portion of the electric part accommodating portion 1a along the inner walls of the holes 1b and when the stage 2 is moved upward, a hook 2b formed on each leg 2a is engaged with the marginal portion of the hole 1b, thereby to establish the raising amount of the stage 2 and to prevent the coming-off.

Figure 13A:
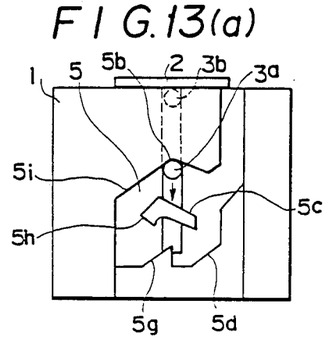
FIGS. 13(a) through 13(b) are schematic views for explaining the operation of a hart-shape cam portion as lock means, a crankshaft and a stage in sequence.
Figure 13B:
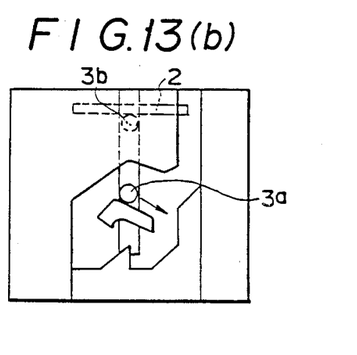
Figure 13C:
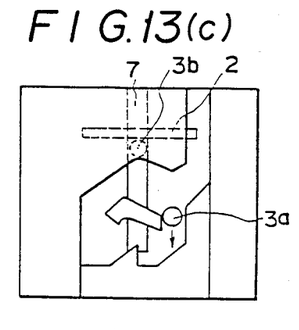
Figure 13D:
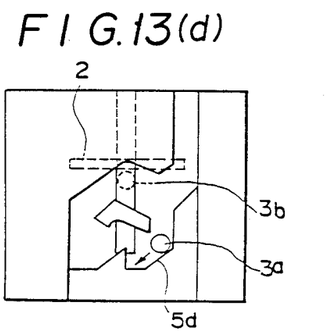
Figure 13E:
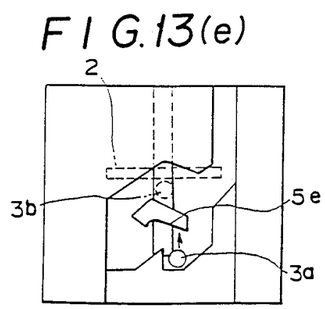
Figure 13F:
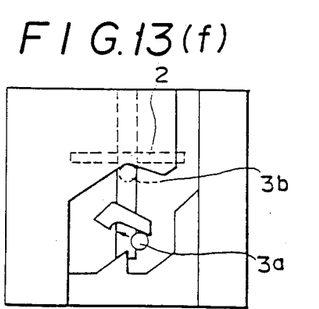
Figure 13G:
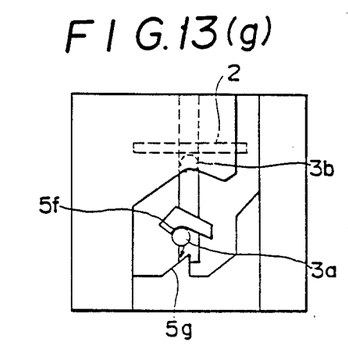
Figure 13H:
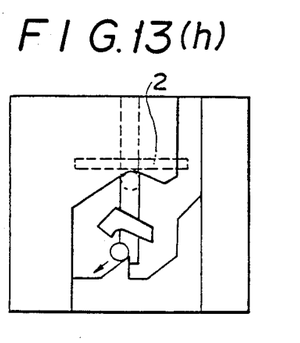
Figure 13I:
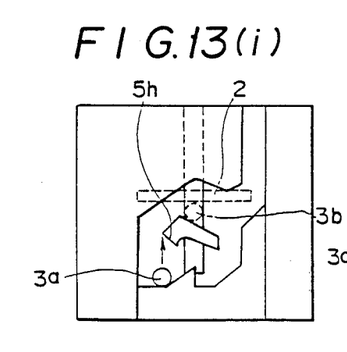
Figure 13J:
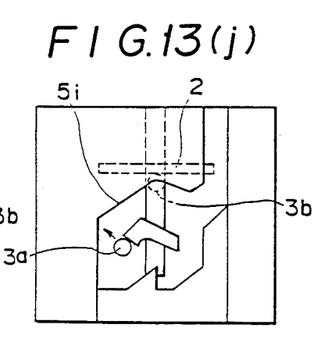
Figure 13K:
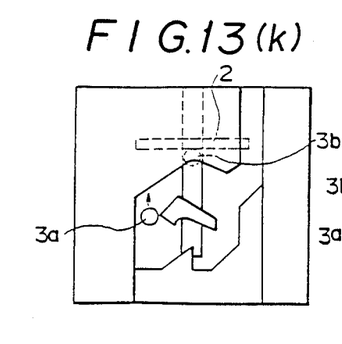
Figure 13L:
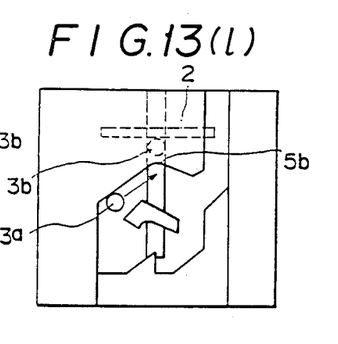
Figure 14A:
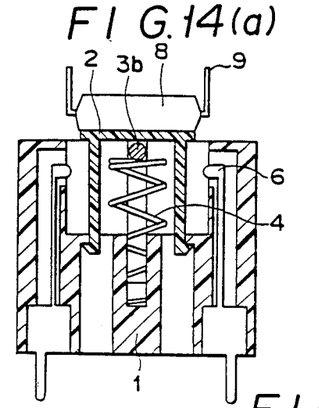
FIG. 14(a) is a sectional view of the socket of FIG. 2 but with an electric part loaded thereon and where the contacting state is released.
Figure 14B:
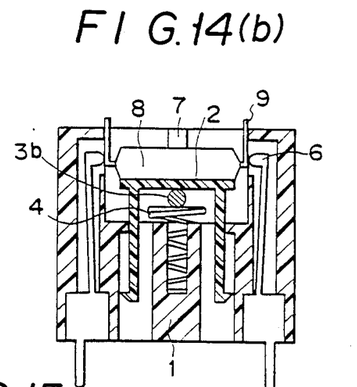
FIG. 14(b) is a sectional view of the socket of FIG. 2 but with an electric part supported on its stage and where the contacting state is maintained.
Figure 15:
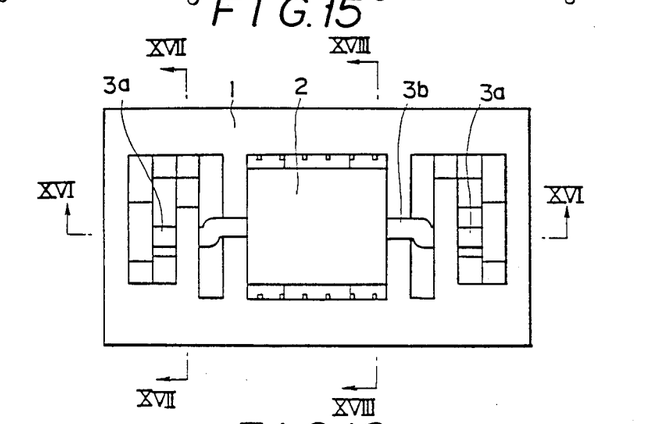
FIG. 15 is a plan view of the socket which is in the state of FIG. 2(b)
Figure 16:
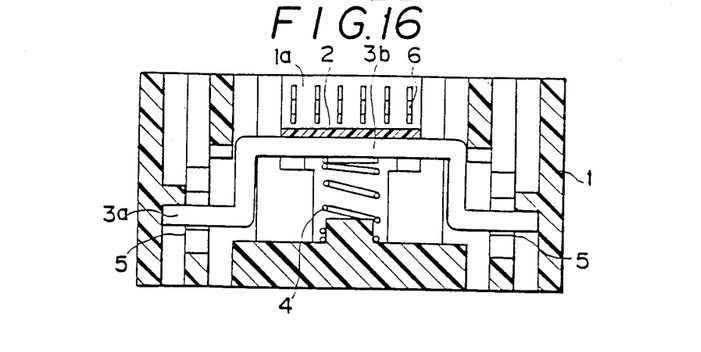
FIG. 16 is a sectional view taken on line XVI—XVI of FIG. 15.
Figure 17:
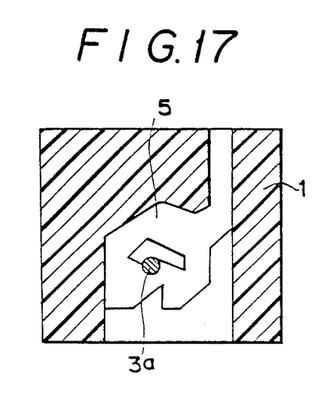
FIG. 17 is a sectional view taken on line XVII—XVII of FIG. 16.
Figure 18:
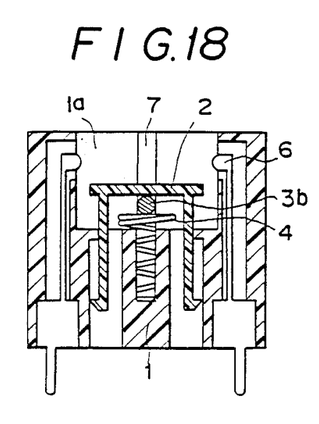
FIG. 18 is a sectional view taken on line XVIII—XVIII of FIG. 17.

FIGS. 13 and 14 are illustrations for explaining the operation of the present invention. FIG. 13(a) shows the stage 2 restrained in the upper position. That is, the crank bar portion 3b of the crank shaft 3 is urged upward by the spring 4 and the crank arm portion 3a of the crank shaft 3 is retained by the stop 5b of the hart-shape cam portion 5, thereby to establish the upper position of the crank arm portion 3a, and the stage 2 is disposed on the crank bar portion 3b. In this way, the stage 1 is restrained in the upper position.

If the stage 2 with the electric part disposed thereon is urged downward against the upward force of the spring 4 from the foregoing state, the crank bar portion 3b, as shown in FIGS. 13(b) through 13(e), is vertically lowered along the guide groove 7 while depressing the spring 4, and the crank arm portion 3a is moved downward in the direction as shown by an arrow in the figures guided by the guide tapers 5c and 5d of the hart-shape cam portion 5.

If the downward force incurred to the stage 2 in the state of FIG. 13(e) is released, the crank bar poriton 3b, as hshown in FIGS. 13(f) through 13(g), is vertically raised by the restoring force of the spring 4 along the guide groove 7 and the crank arm portion 3a is moved upward in the direction shown by an allow in the figures guided by the guide taper 5e of the hart-shape cam portion 5 and the crank arm portion 3a is retained by the stop 5f for establishing the lower position in the hart-shape cam portion 5. As a result, the stage 2 maintains the lower position by its own gravity supported by the crank bar portion 3b locked in the lower position, thereby to obtain the contacting state of the electric part disposed on the stage 2. During the above motion, the crank arm portion 3a is swung about the crank bar portion 3b following a generally circular orbit.

Next, if the stage 2 is urged downward against the upward force of the spring 4 again, the crank bar portion 3b, as shown in FIGS. 13(g) through (i), is vertically lowered along the guide groove 7 while depressing the spring 4 and in the meantime, the crank arm portion 3a is moved downward in the direction as shown by the arrow in the figures guided by the guide taper 5g of the hart-shape cam portion 5. Successively, if the downward force incurred to the stage 2 is released, the crank bar portion 3b, as shown in FIGS. 13(i) through 13(l), is vertically raised by the restoring force of the spring 4 along the guide groove 4 and the crank arm portion 3a is moved upward in the direction as shown by the arrow in the figures guided by the guide tapers 5h and 5i of the hart-shape cam portion 5 and returned to its initial state as shown in FIG. 13(a).

That is, the stage 2 is pushed up to the upper position by the crank bar portion 3b and returned to the state where the contact pieces or leads 9 of the electric part 8 is separated from the contacts 6. During the foregoing motion, the crank arm portion 3a is swung about the crank bar portion 3b.

More specifically, by the cooperative action between the crank shaft 3 and the lock means, as shown in FIG. 14(a), the electric part 8 is disposed on the stage 2, and if the stage 2 is pushed downward through the electric part 8, the stage 2 in the state of FIG. 13(g) is restrained in the lower position as shown in FIG. 14(b), and the contact pieces or leads 9 of the electric part 8 urgedly spread the contacts 6, thereby there can be obtained an resilient contact relation between them. In this way, after it is subjected to the measurement of the electric part, etc., if the stage 2 is pushed downward through the electric part 8 again, the stage 2 is returned to the state of FIG. 14(a) (the state of FIG. 13(a)) to release the contacting relation so that the electric part 8 can be removed.

Figure 19:
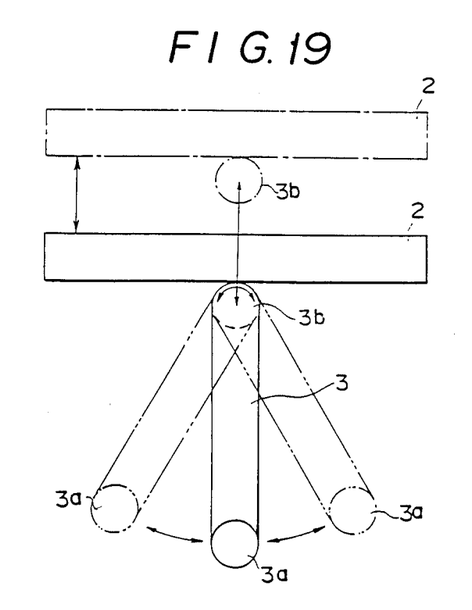
FIG. 19 is a view for explaining the operation of the crankshaft and the stage.

Due to the foregoing structure, when the stage 2 is pushed downward through the electric part 8 as shown in FIG. 19, or when the stage 2 is pushed downward by other suitable means provided to the socket, the upward force of the spring 4 generated as a reaction is acted on the stage 2 through the crank bar portion 3b for performing a movement only limited to the vertical motion on the center axis of the stage 2 by the guide groove 7 and the stage 2 is pushed downward to the lower position against the vertical upward force. On the contrary, the stage 2 is pushed upward to the upper position in accordance with the upward force of the crank bar portion 3b, and in the meantime, the crank arm portion 3a is swung following the generally circular orbit while swinging the crank bar portion 3b itself and engaged with the lock means. The crank bar portion 3b is freely self-rotated with respect to the stage 2 when the crank arm portion 3a is swung. Therefore, when the stage 2 is pushed upward or downward, no harmful biased force is rendered to the stage 2 but only the push-up force is effectively rendered to the stage 2.

In the above-mentioned embodiment, a plurality of contacts of the socket body 1 are provided to two opposite wall sections of the IC accommodating portion 1a. Alternatively, the contacts 6 may be provided to the four wall sides of the IC accommodating portion 1a and the hart-shape cam portion 5 may be formed in the diagonal position of the IC accommodating portion 1a.

Figure 20A:
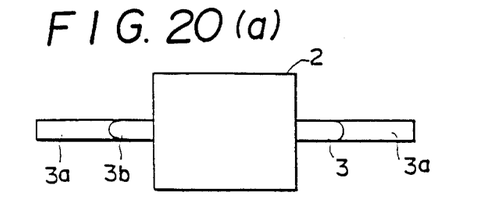
FIG. 20(a) is a plan view showing another embodiment of the stage and the crankshaft of the present invention.
Figure 20B:
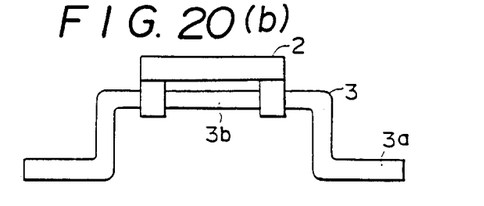
FIG. 20(b) is a front view of the same.
Figure 20C:
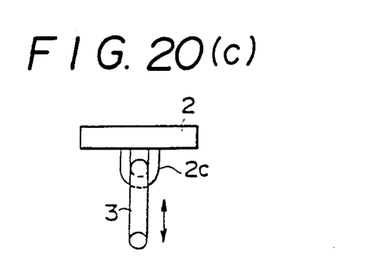
FIG. 20(c) is a side view of the same.
Figure 21A:
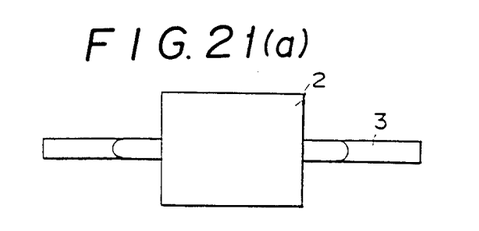
FIG. 21(a) is a plan view showing still another example of the stage and the crankshaft.
Figure 21B:
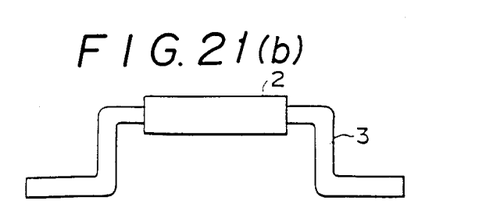
FIG. 21(b) is a front view of the same.
Figure 21C:
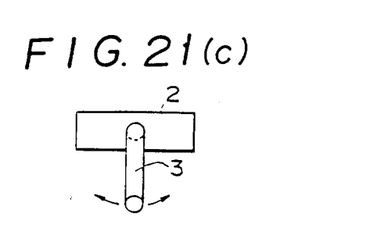
FIG. 21(c) is a side view of the same.

Also, the present invention can be carried out in such a way as that the stage 2 and the crankshaft 3, as shown in FIG. 20, are vertically movably loosely fitted with each other through a mounting device 2c. Furthermore, the present invention can be carried out in such a manner as that as shown in FIG. 21, the crankshaft 3 is pivotally connected to the stage 2 so that the crankshaft 3 can be swung about the crank bar portion 3b.

Other suitable member able to move upward and downward together with may of course be disposed between the stage 2 and the crank bar portion 3b.

Also, instead of pushing down the stage 2 through the electric part in the manner as described, the peripheral portion of the stage 2 may be raised upward to be used as a pressure operating portion or otherwise the stage 2 may be pushed downward through an exclusive-use pressure operating member.

As described in the foregoing, in the conventional device, a pivot pin engaged in a cam groove generates a harmful resistance and an uneven distribution force or biasing force during the horizontal movement thereof and as a result, a smooth and proper vertical movement of a stage is jeopardized. The present invention has solved such problems as mentioned. According to the present invention, when the contact pieces or leads of an electric part and the contacts are resiliently contacted or discontacted by means of operation for lowering the stage, the stage is either pushed downward resisting only the vertical push-up force due to the vertical movement of a crank bar portion of a crankshaft extending across the stage or pushed upward in accordance with the same force. Therefore, the movement is very smooth and operation is quite satisfactory.

The characteristic feature of the present invention is that one crankshaft has both the functions for pushing up the stage and for engaging with the lock means in order to attain the above-mentioned various actions. Therefore, according to the present invention the manufacture is easy and operation for establishing the upper and lower positions is easy.

Furthermore, in the present invention, the crank bar portion for supporting the stage is freely self-rotated and in the meantime, the crank arm portion is swung to engage with the lock means. Therefore, the stage can be properly moved upward and downward without generating an uneven distribution force or biasing force and the engagement with the lock means can also be eprformed smoothly and without fall. The crank bar renders only a vertical push-up force to the stage.

The crank bar portion is capable of pushing up the stage by an even push-up force in the longitudinal direction thereof, and no unevenness is generated in the push-up force.

What is claimed is:

1. A socket for the use of an electric part having contacts disposed in such a manner as to contact with contact pieces of a further electric part and a stage with the electric part supported thereon and able to move between a lower position where the contact pieces are brought into contact with the contacts and an upper position where the contact pieces are brought out of contact with the contacts, said socket including a swingable crankshaft as means for restraining the stage in the upper or lower position, said crankshaft being provided with a crank bar portion disposed in such a manner as to vertically move upward and downward while supporting the stage and to push up the stage during a raising movement thereof and a crank arm portion which is swung about the crank bar portion and engaged with lock means thereby to restrain the stage in the upper and lower positions.

2. A socket for the use of an electric part as claimed in claim 1, wherein said crankshaft is formed of wire material having a circular shape in section.

3. A socket for the use of an electric part as claimed in claim 1, wherein said crankshaft is rendered with an upward force by a spring member.

4. A socket for the use of an electric part as claimed in claim 1, wherein a body of said socket is formed with a guide groove in which the crank arm for guiding the upward and

* * * * *